(12) United States Patent
Mobley

(10) Patent No.: US 11,275,101 B2
(45) Date of Patent: Mar. 15, 2022

(54) SPECTRAL ANALYSIS USING WIRELESS CURRENT SENSORS

(71) Applicant: Schweitzer Engineering Laboratories, Inc., Pullman, WA (US)

(72) Inventor: James Mobley, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 245 days.

(21) Appl. No.: 16/592,154

(22) Filed: Oct. 3, 2019

(65) Prior Publication Data

US 2021/0102981 A1 Apr. 8, 2021

(51) Int. Cl.
*G01R 23/20* (2006.01)
*G01R 15/18* (2006.01)
*H02J 3/00* (2006.01)

(52) U.S. Cl.
CPC ............ *G01R 23/20* (2013.01); *G01R 15/18* (2013.01); *H02J 3/00* (2013.01)

(58) Field of Classification Search
CPC ........ G01R 1/00; G05B 1/00; G05B 2219/00; H02H 1/00; G06N 3/00
See application file for complete search history.

(56) References Cited

U.S. PATENT DOCUMENTS 8,924,169 B1 * 12/2014 Ledenev ................. H02S 50/10
702/58
9,194,898 B2 * 11/2015 Banhegyesi ......... G01R 21/133
2013/0211751 A1 * 8/2013 Park ....................... G01R 21/06
702/61
2014/0347069 A1 * 11/2014 Krumpholz ............ G01R 31/52
324/541
2015/0331025 A1 * 11/2015 Arashima ............ G01R 22/063
702/62
2018/0128859 A1 * 5/2018 Shamir .................. G01R 15/18

OTHER PUBLICATIONS

Schweitzer Engineering Laboratories, Inc. "SEL-734B Compact Enclosure Capacitor Bank Controller", SEL AcSELerator Quickset Design Template Guide, Dec. 14, 2018.
Schweitzer Engineering Laboratories, Inc. "SEL-734B Full-Size Enclosure Capacitor Bank Controller", SEL Quickset® Design Template Guide, Dec. 14, 2018.

* cited by examiner

*Primary Examiner* — Jermele M Hollington
*Assistant Examiner* — Temilade S Rhodes-Vivour
(74) *Attorney, Agent, or Firm* — Bradley W. Schield

(57) ABSTRACT

The present disclosure relates to spectral analysis in wireless current sensors. For example, a wireless current sensor (WCS) includes current transformer windings that harvest electrical energy from a power line and allow the WCS to obtain current measurements of the power line. The WCS includes a processor that obtains the current measurements of the power line via the current transformer windings. The processor generates a frequency domain representation of the current on the power line using the current measurements. The processor sends a wireless signal indicating results from the frequency domain representation to an intelligent electronic device (IED) that monitors the power line to allow the TED to analyze the results for anomalies.

19 Claims, 4 Drawing Sheets

SPECTRAL ANALYSIS USING WIRELESS CURRENT SENSORS

TECHNICAL FIELD

The present disclosure relates generally to spectral analysis and, more particularly, to a wireless current sensor that uses spectral analysis to monitor a power line.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Various intelligent electronic devices (IEDs) may be used in monitoring, control, and protection of equipment of the electric power delivery system. To make control and protection decisions, sensors may be wired from the IED to a power line to detect electrical characteristics of the power line. For example, current transformers (CTs) may be installed on the power line to provide current to the IED that is proportional to the current on the power line. However, it may be difficult, costly, or time consuming to run wires for wired CTs between the power line and the IED.

As explained below, a wireless current sensor (WCS) may obtain electrical energy to power the WCS from current from CT windings of the WCS on a power line. The WCS may obtain current measurements from the power line via the CT windings. The WCS may generate a frequency domain representation of the current on the electrical equipment using the current measurements. The WCS may send wireless signals indicating the results of the frequency domain representation to an IED that monitors the equipment to allow the IED to perform control or protection operations based on the results.

Figure 1:
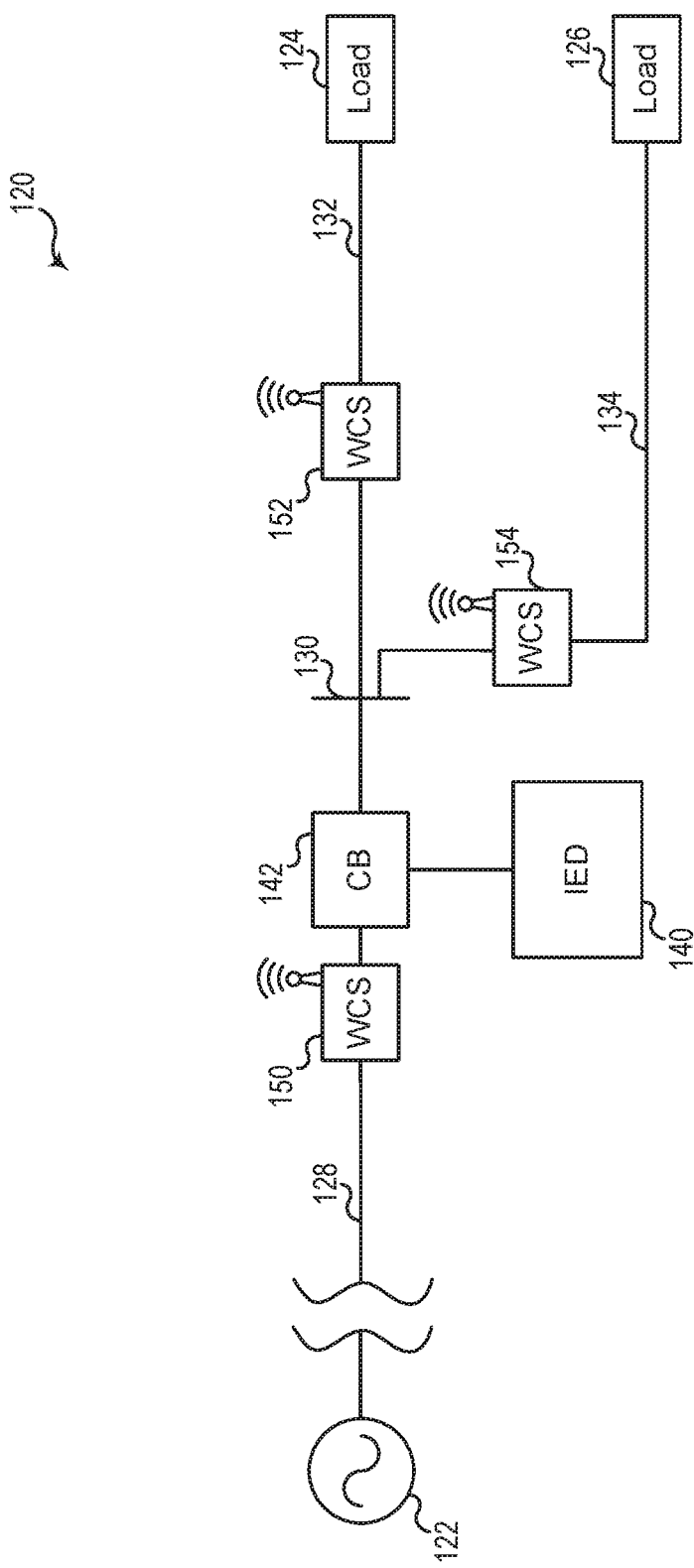
FIG. 1 is a one-line diagram of an electric power delivery system with wireless current sensors (WCSs) that perform spectral analysis of current on a power line, in accordance with an embodiment.

FIG. 1 illustrates a one-line diagram of an embodiment of an electric power delivery system 120, which may have various electrical equipment, such as electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system includes a first power source 122 that delivers power to loads 124 and 126. In the illustrated embodiment, a power line 128 (e.g., transmission line) may provide power to a bus 130. Power lines 132 and 134 (e.g., distribution lines) may be connected to the bus 130. The power lines 132 and 134 may deliver electric power to the loads 124 and 126. As mentioned above, IEDs, such as IED 140, may be installed on equipment of the electric power delivery system 120 to monitor, control, or protect the electric power delivery system 120.

As used herein, an IED (such as IED 140) may refer to any microprocessor-based device that monitors, controls, automates, and/or protects monitored equipment within the system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, digital sample publishing units, and the like. The term IED may be used to describe an individual IED or a system comprising multiple IEDs.

The IED 140 may monitor harmonics of the power lines 128, 132, and 134 which may allow the IED 140 to perform various control and protection operations. For example, various harmonics may be associated with certain faults or anomalies of certain loads. As such, the IED 140 may perform frequency domain analysis, such as fast fourier transform (FFT) analysis, in which the IED 140 transforms the current measurements into the frequency domain.

As mentioned above, wired current transformers (CTs) may be installed on the power lines 128, 132, and 134 and wired to the IED 140 to allow the IED 140 to obtain current measurements that are proportional to the current on the power lines 128, 132, and 134. Such wiring may be costly, difficult, or time consuming.

As illustrated, the IED 140 may be communicatively connected to WCSs 150, 152, and 154 to monitor the current of the respective power line 128, 132, and 134. For example, the WCSs 150, 152, and 154 may provide current amplitude, current phase, zero crossing times, among others. Further, the WCSs 150, 152, and 154 may provide results from the frequency domain representation of the current measurements to the IED 140 to reduce power consumption while allowing the IED 140 to perform control and protection operations on the electric power delivery system 120. The IED 140 may send signal(s) to a circuit breaker 142 to open or close the circuit breaker 142 based on the monitored characteristics (e.g., current measurements, voltage measurements, etc.) of the power system.

Figure 2:
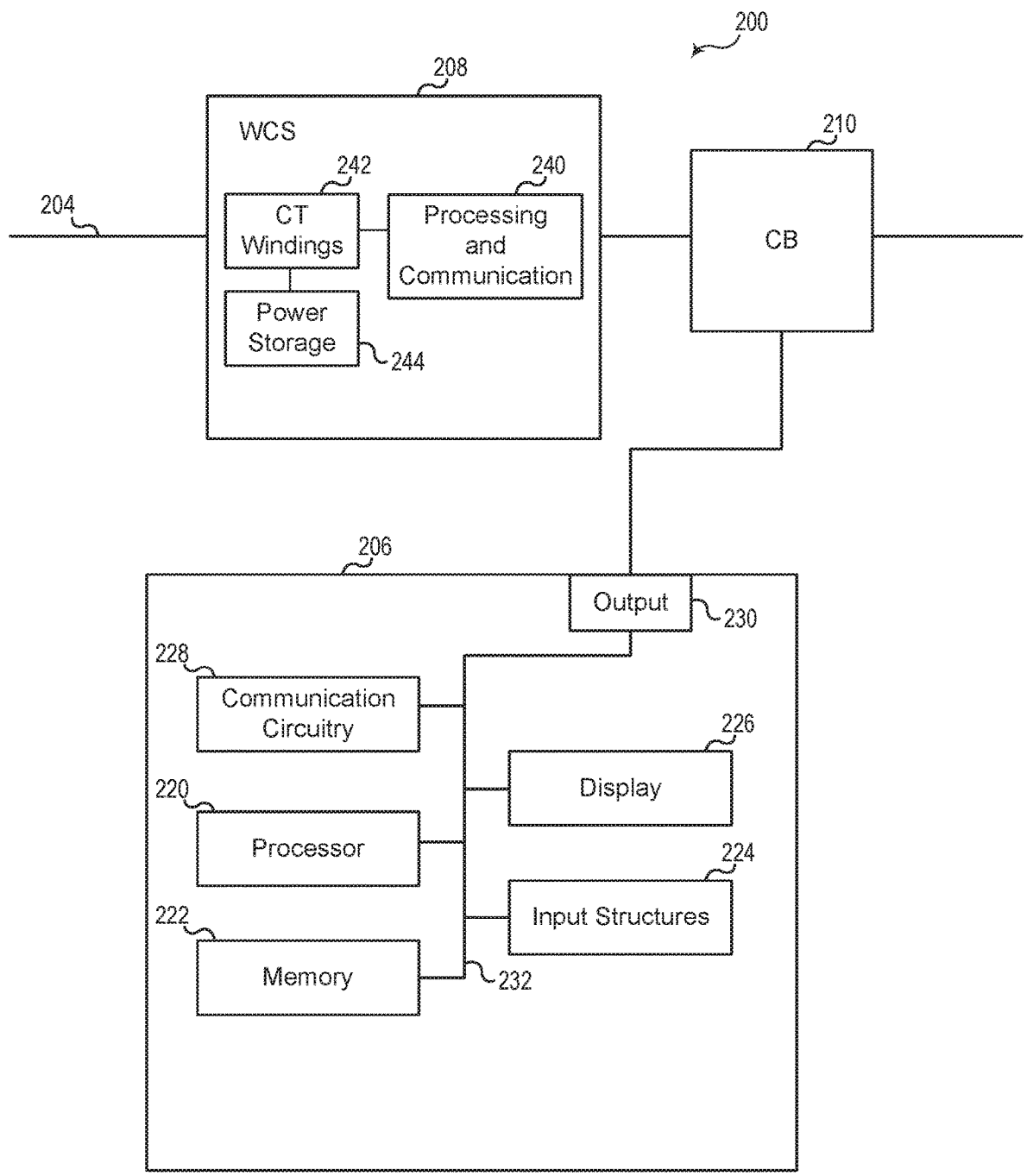
FIG. 2 is a block diagram of a WCS of FIG. 1 that provides results of spectral analysis to an IED, in accordance with an embodiment.

FIG. 2 is an embodiment of a block diagram of a WCS 208, such as the WCSs 150, 152, and 154 of FIG. 1, that may communicate results of frequency domain representation analysis to an IED 206, such as IED 140. The results may be used by the IED 206 to perform control operations and protection operations, such as opening a circuit breaker 210 due to an occurrence of an anomaly (e.g., overcurrent condition, harmonic conditions that exceed a threshold, harmonic conditions of a particular pattern, etc.) on the power line.

In the illustrated embodiment, the IED 206 includes a processor 220, a computer-readable storage medium 222, input structures 224, a display 226, communication circuitry 228, and output circuitry 230. The IED 206 may include one or more bus(es) 232 connecting the processor 220 or processing unit(s) to the computer-readable storage medium 222, the input structures 224, the display 226, the output circuitry 230, and/or the communication circuitry 228. The computer-readable storage medium 222 may be embodied as memory, such as random access memory (RAM), read only memory (ROM), or a combination thereof, and may include or interface with software, hardware, or firmware modules for implementing various portions of the systems and methods described herein. The computer-readable storage medium 222 may be the repository of one or more modules and/or executable instructions configured to implement any of the processes described herein.

The processor 220 may process inputs received via the communication circuitry 228. The processor 220 may operate using any number of processing rates and architectures. The processor 220 may be configured to perform various algorithms and calculations described herein using computer executable instructions stored on computer-readable storage medium 222. The processor 220 may be embodied as a microprocessor. In certain embodiments, the processor 220 and/or the computer-readable storage medium 222 may be embodied as discrete electrical components, a general purpose integrated circuit, one or more Application Specific Integrated Circuits ("ASICs"), a Field Programmable Gate Array ("FPGA"), and/or other programmable logic devices. The processor 220 and/or the computer-readable storage medium 222 may be referred to generally as processing circuitry.

The communication circuitry 228 may include a transceiver, antenna, and/or communication ports, such as ethernet and serial ports. In some embodiments, the IED 206 may remotely control switches of the capacitor banks using by communicating using the ethernet or serial ports. Further, the communication circuitry 228 may include a wireless transceiver to communicate with one or more electronic devices, such as the wireless current sensor 208. The IED 206 may include a display screen 226 that displays information to notify an operator of operating parameters of the electric power delivery system 120, such as current measurements, voltage measurements, capacitor bank status, power flow direction, etc. The input structures 224 may include buttons, controls, universal serial bus (USB) ports, or the like, to allow a user to provide input settings to the IED 206. In some embodiments, the display 226 may be a touchscreen display.

The WCS 208 may communicate current information to the IED 206, such as current phase and/or current magnitude. As explained in detail below, the WCS 208 may communicate results from a frequency domain representation of the current to the IED 206. The WCS 208 may include CT windings 242, power storage device(s), and processing and communication circuitry 240.

By enclosing the power line 204 with the CT windings 242, current through the power line 204 may induce a proportional current through the CT windings 242. The WCS 208 may be a line-powered device in which the CT windings 242 harvest electrical energy from the power line 204 via current induced through the windings 242 to power operations on the WCS 208. Further, the CT windings 242 may be used by the WCS 208 to obtain current measurements proportional to the current of the power line 204. The processing and communication circuitry 240 may include similar hardware to the hardware described with respect to the IED 206, such as the processor 220, the memory 222, and the communication circuitry 228.

Figure 3:
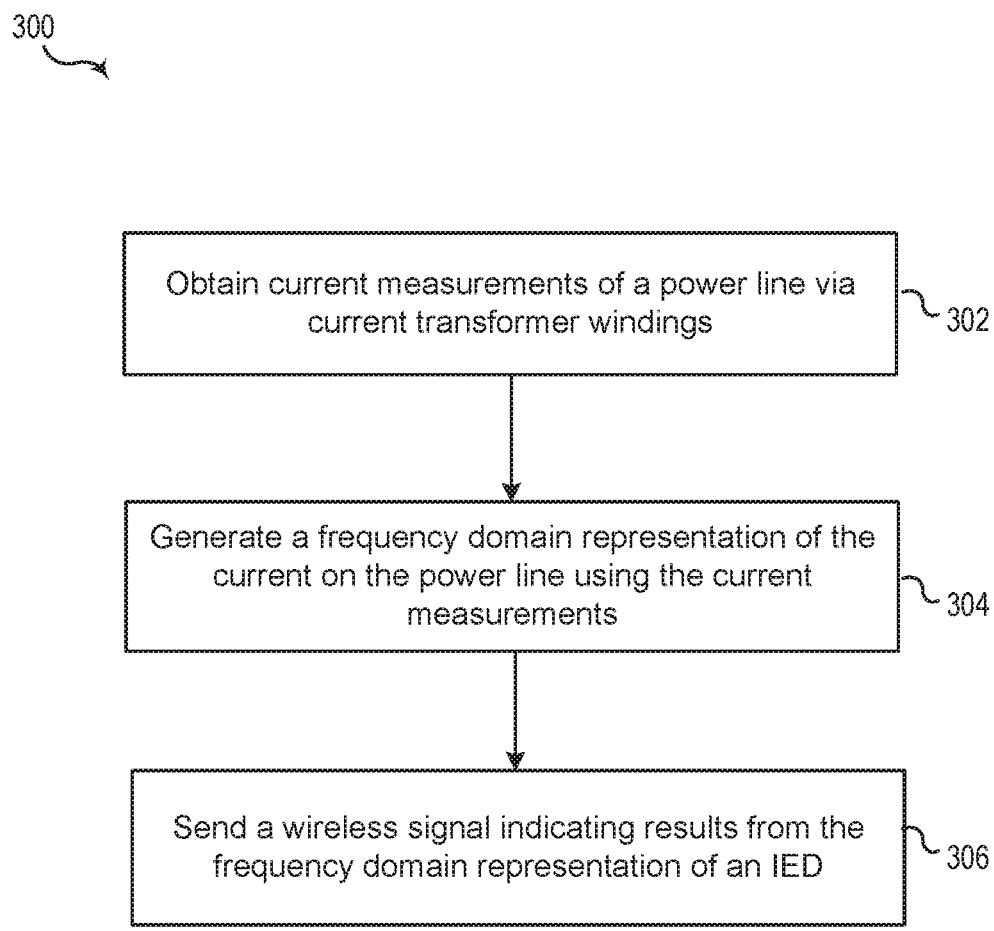
FIG. 3 is a flow diagram of a process that may be performed by the WCS of FIG. 1 in conjunction with the IED, in accordance with an embodiment.

FIG. 3 is an embodiment of a flow diagram of a process 300 that may be performed by the WCS 208 in conjunction with the IED 206 to monitor harmonic content of a power system, in accordance with an embodiment. The process 500 may be stored as instructions (e.g., code) in memory to be executed by a processor of the processing and communication circuitry 240. In other embodiments, the processing and communication circuitry 240 may include discrete components to perform the processes described herein.

The processing and communication circuitry 240 may obtain the current measurements of the power line 204 via the current transformer windings 242 (block 302). As mentioned above, the CT windings 242 may provide current measurements (e.g., via an analog to digital converter) to the processing and communication circuitry 240 that are proportional to the current on the power line. In some embodiments, the power storage devices, such as a rechargeable battery or a hybrid-layer capacitor HLC), may be charged via the CT windings to allow the WCS 208 to sample the current repeatedly within a period to obtain measurements at a rate that is sufficient to perform FFT analysis at a particular resolution. In certain embodiments, the WCS 208 may ensure charge of the power storage device 244 prior to performing the repeated measurements. The processing and communication circuitry 240 may obtain the current measurements of the power line for a predetermined period of time and store the current measurements over the period in the memory of the WCS during the predetermined period of time to allow for generation of the frequency domain representation.

The processing and communication circuitry 240 may generate a frequency domain representation of the current on the power line 204 using the current measurements (block 304). For example, the WCS 208 may perform fast fourier transform (FFT) analysis on the current measurements in which the WCS 208 transforms the current measurements into a frequency domain representation. In other embodiments, the processing and communication circuitry 240 may perform discrete fourier transform (DFT) analysis or any other suitable method to generate the frequency domain representation. The WCS 208 may then determine various harmonic content of the power line based on the frequency domain representation. For example, the WCS 208 may determine the power system fundamental magnitude and phase of the current measurements. In some embodiments, the WCS 208 may determine a set of harmonic magnitudes that include the fundamental, third harmonic, fifth harmonic, seventh harmonic, etc.

The processing and communication circuitry 240 may send a wireless signal indicating results from the frequency domain representation to an intelligent electronic device (IED) that monitors the power line to allow the IED to analyze the results for anomalies (block 306). The results may include the real and imaginary parts of the frequency domain representations. For example, the processing and communication circuitry 240 may provide harmonic content of the current on the power line. In some embodiments, the processing and communication circuitry 240 may send the set of harmonic quantities, such as a first harmonic quantity of a first frequency (e.g., a fundamental frequency of the power system), a second harmonic quantity of a second frequency (e.g., a third harmonic), a third harmonic quantity of a third frequency (e.g., a fifth harmonic). The set of harmonic quantities may be interharmonics and/or subharmonics.

Figure 4:
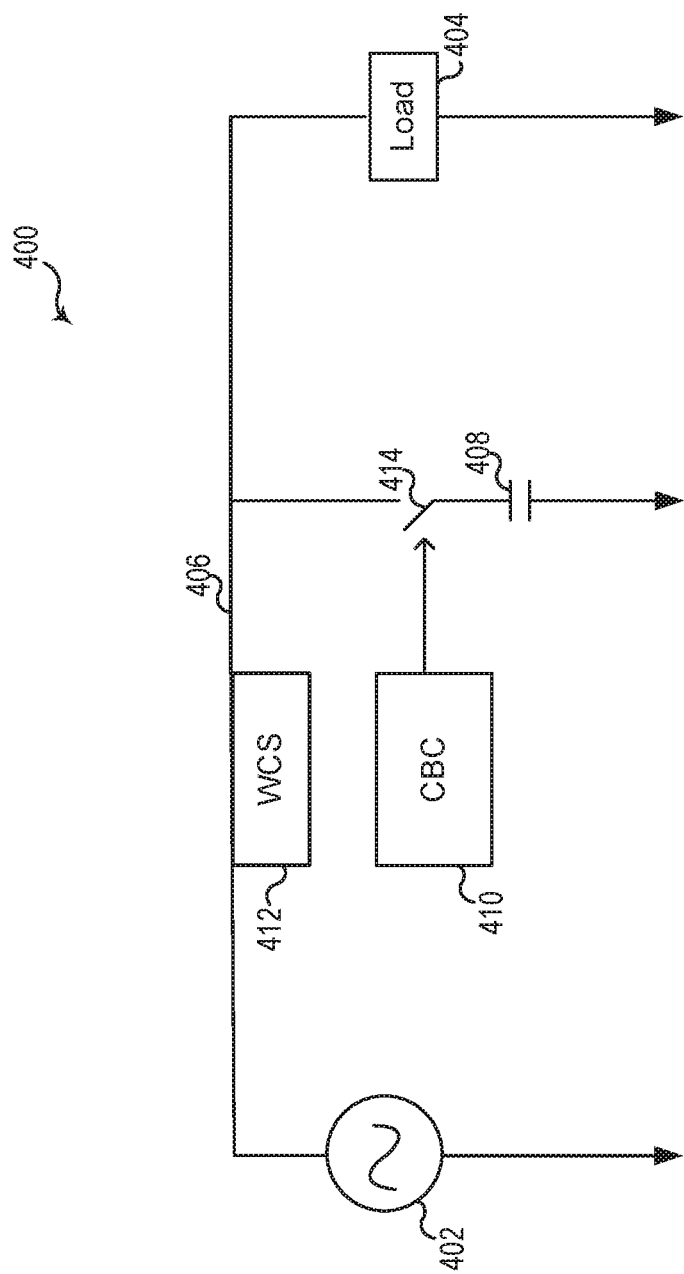
FIG. 4 is a circuit diagram of an electric power delivery system with a capacitor bank controller (CBC) that controls a capacitor bank based at least in part on harmonic content from a WCS, in accordance with an embodiment.

FIG. 4 is a circuit diagram of a power system 400 with a phase of a power line that uses harmonic content from a wireless current sensor to determine to connect or disconnect a capacitor bank from the power line. As illustrated, a power line 406 may communicatively couple a power source 402 to a load 404 to allow power from the power source 22 to be delivered to the load 404. Although illustrated in single-line form for purposes of simplicity, the electric power delivery system 20 may be a multi-phase system, such as a three-phase electric power delivery system.

A capacitor bank 408 may provide reactive power to the load 404 depending on the current characteristics of the power line 406. A capacitor bank controller (CBC) may be communicatively coupled to one or more WCSs 412. The CBC 410 may monitor the electrical conditions of the power line 406 and may determine whether to connect or disconnect the capacitor bank 408 based on the current characteristics. For example, the capacitor bank may perform power factor correction, volt-ampere reactive (VAR) control, or current control to improve the quality of power being delivered to the load 404. The CBC 410 may send signal(s) to one or more switching devices 414 to connect the capacitor bank 408 to improve the power factor in the power delivery system 400. The CBC 410 and the WCS 412 may include similar hardware to those described with respect to the IED 206 and the WCS 208 of FIG. 2 and may be used to perform the process described with respect to FIG. 3. While illustrated as a single capacitor, note that several capacitors may be used and the particular size of the capacitor bank may depend on the application.

As explained above, the WCS 412 may generate a frequency domain representation of the current on the power line using current measurements. The WCS 412 may send a wireless signal indicating harmonic content from the frequency domain representation to the CBC 410. The CBC 410 may obtain the harmonic content and may determine whether to connect or disconnect the capacitor bank based on the harmonics of the current on the power line 406. For example, the CBC 410 may compare the fundamental frequency magnitude to a threshold magnitude for determining whether to connect or disconnect the capacitor bank and connect or disconnect the capacitor bank upon exceeding the threshold.

Power may be saved by sending the harmonic quantities as magnitudes of the harmonics instead of individual current measurements to perform point on waveform analysis at the IED. By communicating results from frequency domain representations, the results may allow the IED to perform control and protection operations based on harmonics while limiting the power usage at the WCS and IED and eliminating wiring between the WCS and IED The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A line-powered wireless current sensor (WCS), comprising:
    current transformer windings configured to harvest electrical energy from a power line and allow the WCS to obtain current measurements of the power line;
    an energy storage device configured to be charged via the current transformer windings;
    memory; and
    a processor operatively coupled to the memory, wherein the processor is configured to:
        ensure that the energy storage device is charged to sample the current repeatedly within a predetermined period of time to obtain measurements at a rate that is sufficient to generate a frequency domain representation of current;
        obtain the current measurements of the power line via the current transformer windings;
        store the current measurements over the predetermined period of time in the memory of the wireless current sensor to allow for generation of the frequency domain representation;
        generate the frequency domain representation of the current on the power line using the current measurements; and
        send a wireless signal indicating results from the frequency domain representation to an intelligent electronic device (IED) that monitors the power line to allow the IED to analyze the results for anomalies.

2. The WCS of claim 1, wherein the results comprise the real and imaginary parts of the frequency domain representation.

3. The WCS of claim 1, wherein the processor is configured to perform fast fourier transform (FFT) analysis on the current measurements to obtain the frequency domain representation.

4. The WCS of claim 1, wherein the processor is configured to send harmonic content of the power line to the IED to allow the IED to perform control actions or protection actions based on the harmonic content of the power line.

5. The WCS of claim 4, wherein the processor is configured to send the harmonics of the power system fundamental frequency as the harmonic content.

6. The WCS of claim 4, wherein the processor is configured to send the results without providing the current measurements to the IED to reduce power consumption by limiting communication of the WCS while allowing the IED to perform control actions or protection actions based on the harmonic content.

7. The WCS of claim 1, wherein the processor is configured to perform discrete fourier transform (DFT) analysis to generate the frequency domain representation.

8. The WCS of claim 1, wherein the current transformer windings are configured to charge a rechargeable battery or a hybrid-layer capacitor (HLC) to power the WCS.

9. A method, comprising:
obtaining, via a wireless current sensor (WCS), electrical energy from a power line to power the WCS;
ensuring, via the WCS, that an energy storage device of the WCS is charged to sample current repeatedly within a period of time to obtain measurements at a rate that is sufficient to generate a frequency domain representation of current;
obtaining, via the WCS, current measurements indicating current of the power line;
storing, via the WCS, the current measurements over the predetermined period of time in memory of the WCS to allow for generation of the frequency domain representation of current;
generating, via the WCS, the frequency domain representation of the current on the power line using the current measurements; and
sending, via the WCS, a wireless signal indicating results from the frequency domain representation to an intelligent electronic device (IED) that monitors the power line to allow the IED to analyze the results.

10. The method of claim 9, wherein the results comprise the real and imaginary parts of the frequency domain representation.

11. The method of claim 10, comprising:
determining, via the IED, that a frequency threshold has been exceeded based on the results; and
performing, via the IED, a control action upon exceeding the frequency threshold.

12. The method of claim 11, wherein the control action comprises sending, via the IED, a signal to a circuit breaker to open the circuit breaker.

13. The method of claim 10, wherein the results comprise a set of harmonic quantities.

14. The method of claim 13, wherein the harmonic quantities comprise at least one of a second harmonic magnitude, a third harmonic magnitude, a fifth harmonic magnitude, and a seventh harmonic magnitude.

15. A tangible, non-transitory, computer-readable medium comprising instructions that, when executed by a processor, cause the processor to:
ensure that an energy storage device of a wireless current sensor (WCS) is charged to sample current repeatedly within a period of time to obtain measurements at a rate that is sufficient to generate a frequency domain representation of current;
obtain current measurements of a power line via current transformer windings of the WCS;
store, via the WCS, the current measurements over the predetermined period of time in memory of the non-transitory, computer-readable medium of the WCS to allow for generation of the frequency domain representation of the current;
generate the frequency domain representation of the current on the power line using the current measurements; and
send a wireless signal indicating results from the frequency domain representation to an intelligent electronic device (IED) that monitors the power line to allow the IED to analyze the results for anomalies.

16. The computer-readable medium of claim 15, wherein the results comprise a set of harmonic quantities.

17. The computer-readable medium of claim 16, wherein the set of harmonic quantities comprise a first harmonic quantity of a first frequency, a second harmonic quantity of a second frequency, and a third harmonic quantity of a third frequency.

18. The computer-readable medium of claim 15, wherein the results comprise the real and imaginary parts of the frequency domain representation.

19. The computer-readable medium of claim 15, wherein the processor is configured to perform fast fourier transform (FFT) analysis on the current measurements to obtain the frequency domain representation.

* * * * *